United States Patent
Tanabe et al.

(10) Patent No.: US 9,686,869 B2
(45) Date of Patent: Jun. 20, 2017

(54) PRINTED CIRCUIT BOARD AND METHOD OF MANUFACTURING PRINTED CIRCUIT BOARD

(71) Applicant: Nitto Denko Corporation, Osaka (JP)

(72) Inventors: Hiroyuki Tanabe, Osaka (JP); Hitoki Kanagawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/753,512

(22) Filed: Jun. 29, 2015

(65) Prior Publication Data
US 2015/0382451 A1    Dec. 31, 2015

(30) Foreign Application Priority Data
Jun. 30, 2014 (JP) ................. 2014-134901

(51) Int. Cl.
| H05K 1/09 | (2006.01) |
| H05K 1/03 | (2006.01) |
| H05K 1/00 | (2006.01) |
| H05K 1/16 | (2006.01) |
| H05K 3/28 | (2006.01) |
| H05K 3/24 | (2006.01) |

(52) U.S. Cl.
CPC .............. *H05K 3/28* (2013.01); *H05K 3/244* (2013.01)

(58) Field of Classification Search
CPC ................................. H05K 3/28; H05K 3/244
USPC .......................... 174/251, 255, 260; 361/760
See application file for complete search history.

(56) References Cited

U.S. PATENT DOCUMENTS

| 6,096,482 A * | 8/2000 | Omote ............... C08G 73/1025 430/311 |
| 2005/0061542 A1* | 3/2005 | Aonuma ................ H05K 3/243 174/255 |
| 2006/0023435 A1* | 2/2006 | Ooyabu ................. H05K 1/181 361/760 |
| 2006/0087011 A1* | 4/2006 | Kanagawa ........... G11B 5/4833 257/676 |
| 2007/0074899 A1* | 4/2007 | Aonuma .................. H05K 3/44 174/260 |
| 2009/0316300 A1* | 12/2009 | Kamei ................. H05K 1/0237 360/110 |
| 2011/0011626 A1 | 1/2011 | Yamauchi et al. |
| 2012/0140360 A1 | 6/2012 | Contreras et al. |
| 2012/0279757 A1 | 11/2012 | Ishii et al. |
| 2013/0133939 A1 | 5/2013 | Ishii |
| 2014/0338958 A1 | 11/2014 | Yamauchi et al. |

FOREIGN PATENT DOCUMENTS

| JP | 2011-040420 A | 2/2011 |
| JP | 2012-123896 A | 6/2012 |
| JP | 2012-235013 A | 11/2012 |
| JP | 2013-114708 A | 6/2013 |

* cited by examiner

*Primary Examiner* — Sherman Ng
(74) *Attorney, Agent, or Firm* — Panitch Schwarze Belisario & Nadel LLP

(57) ABSTRACT

A write wiring trace is formed over insulating layer. A coating layer, being directly in contact with at least a first portion of a surface of the write wiring trace, is formed over the insulating layer to cover the write wiring trace. A connection terminal is formed over the insulating layer to be electrically connected to the write wiring trace and exposed from the coating layer.

12 Claims, 14 Drawing Sheets

F I G. 1
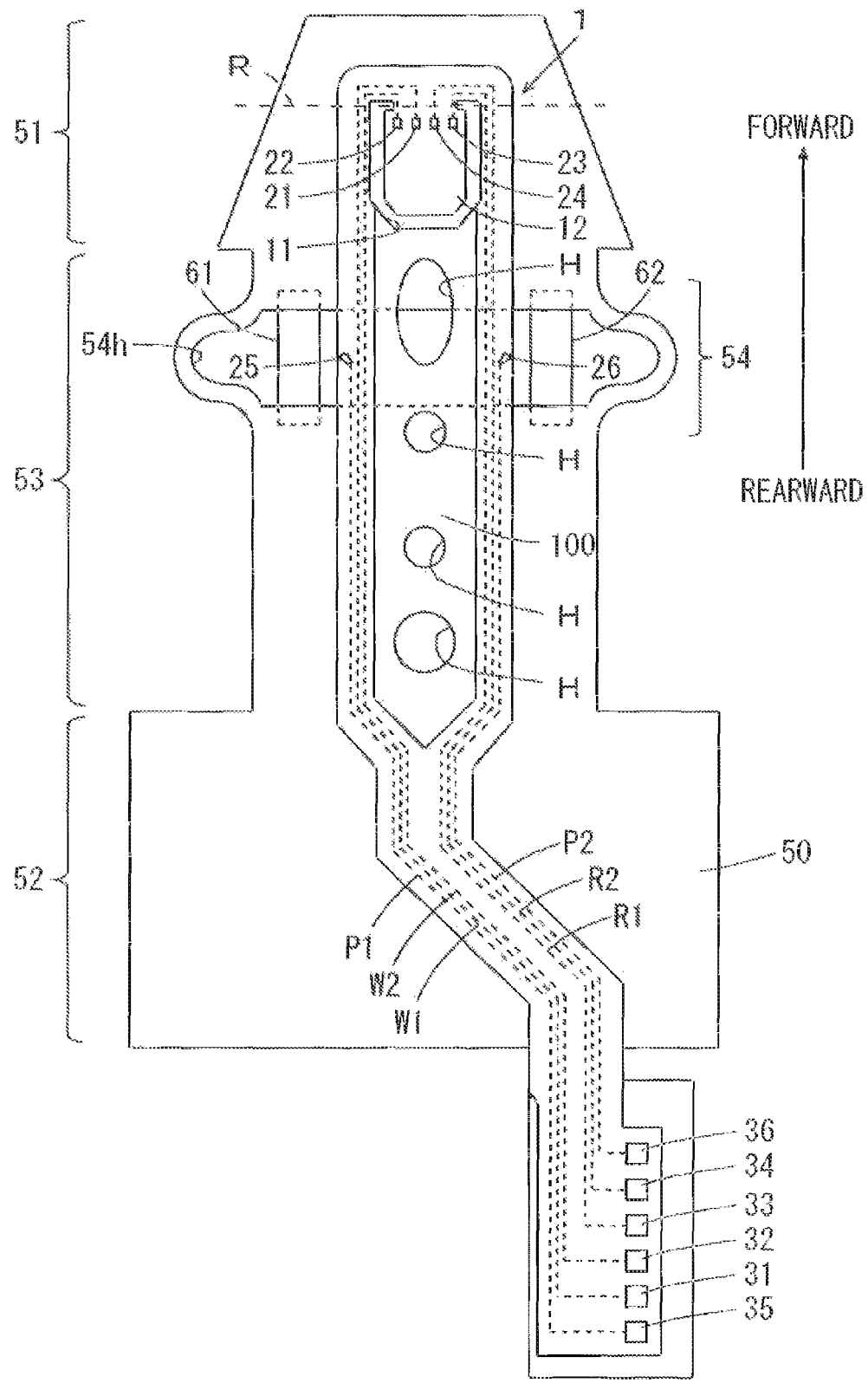

PRINTED CIRCUIT BOARD AND METHOD OF MANUFACTURING PRINTED CIRCUIT BOARD

BACKGROUND OF THE INVENTION

Field of the Invention

The present invention relates to a printed circuit board and a method of manufacturing the printed circuit board.

Description of Related Art

Conventionally, printed circuit boards have been used in various types of electric equipment and electronic equipment. In JP 2012-235013 A, a circuit substrate for suspension is shown as a printed circuit board used for positioning a magnetic head in a magnetic disc device.

In the printed circuit board described in JP 2012-235013 A, an insulative base layer is formed over a conductive support substrate. A conductor circuit trace is formed over the base layer. A thin metal film is formed over a surface of the conductor circuit trace by electroless nickel plating. A cover layer is formed to cover the conductor circuit trace on which the thin metal film is formed. A connection terminal is formed at an end of the conductor circuit trace to be exposed from the cover layer.

BRIEF SUMMARY OF THE INVENTION

In recent years, electric signals used in electric equipment or electronic equipment have higher frequencies. However, when a high-frequency electrical signal is transmitted by the conductor circuit trace of the printed circuit board described in JP 2012-235013 A. a loss of the electrical signal is increased. Therefore, it is required that a transmission loss of the electrical signal is also reduced in a high frequency band in the printed circuit board.

An object of the present invention is to provide a printed circuit board in which a loss of an electrical signal is also reduced in a high frequency band. A further object is to provide a method of manufacturing the printed circuit board.

As a result of various experiments and consideration, the present inventors have discovered that the transmission loss of the electrical signal in the high frequency band can be reduced by direct contact of the wiring trace with the cover layer not via the thin metal film, and hit upon the below-mentioned present invention.

(1) A printed circuit board according to one aspect of the present invention includes a first insulating layer, a wiring trace formed over the first insulating layer, a second insulating layer formed over the first insulating layer to cover the wiring trace, and a connection terminal formed over the first insulating layer to be electrically connected to the wiring trace and exposed from the second insulating layer, wherein a surface of the wiring trace has a first portion, and the second insulating layer, being directly in contact with at least the first portion of the wiring trace, covers the wiring trace.

In this printed circuit board, the wiring trace is formed over the first insulating layer. The second insulating layer, being directly in contact with at least the first portion of the surface of the wiring trace, is formed over the first insulating layer to cover the wiring trace. The connection terminal is formed over the first insulating layer to be electrically connected to the wiring trace and exposed from the second insulating layer.

This configuration causes at least the first portion of the wiring trace to directly come into contact with the second insulating layer. As a result of the above-mentioned experiments and consideration by the present inventors, the transmission loss of the electric signal is reduced by direct contact of the wiring trace with the second insulating layer. Thus, the transmission loss of the electric signal can be also reduced in the high frequency band.

(2) The surface of the wiring trace may have a second portion that is different from the first portion, and a thin metal film may be formed over the second portion of the wiring trace, and the second insulating layer, being directly in contact with the first portion of the wiring trace and being in contact with the thin metal film, may be formed to cover the wiring trace.

In this case, it is easier to improve adhesion of the wiring trace to the second insulating layer in the second portion while the transmission loss of the electrical signal in the first portion of the wiring trace is reduced. Thus, the transmission loss of the electrical signal in the high frequency band can be reduced while stripping of the second insulating layer is prevented. Further, it is unnecessary to perform surface treatment, for attaching the wiring trace to the second insulating layer, on the entire wiring trace.

(3) The wiring trace may have an end connected to the connection terminal, and the second portion of the wiring trace may be positioned on a surface of the end of the wiring trace.

In this case, adhesion of the wiring trace to the second insulating layer is improved at the end of the wiring trace. Thus, generation of a gap between the first insulating layer and the second insulating layer is prevented at the end of the wiring trace. As a result, a chemical liquid used for manufacture of the printed circuit board is prevented from entering the gap between the first insulating layer and the second insulating layer.

(4) The first portion may be a portion except for the second portion of the wiring trace.

In this case, the transmission loss of the electrical signal can be reduced in the entire portion except for the end of the wiring trace while the adhesion of the wiring trace to the second insulating layer is improved at the end of the wiring trace (5) The second portion may include a boundary portion between the wiring trace and the connection terminal, the connection terminal may include a first conductor layer and a second conductor layer formed over the first conductor layer, and the thin metal layer may be positioned between the wiring trace and the second insulating layer and between the first conductor layer and the second conductor layer, in the second portion.

In this case, the adhesion of the wiring trace to the second insulating layer is improved in the boundary portion between the wiring trace and the connection terminal. Thus, stripping of the second insulating layer in the boundary portion between the wiring trace and the connection terminal can be sufficiently prevented.

(6) Adhesivity of the thin metal film to the second insulating layer may be higher than adhesivity of the wiring trace to the second insulating layer.

In this case, the adhesion of the wiring trace to the second insulating layer can be reliably improved by the thin metal film.

(7) The wiring trace may include copper, and the thin metal film may include nickel, gold, platinum, silver or tin.

In this case, the thin metal film including nickel, gold, platinum, silver or tin is interposed between the wiring trace including copper and the second insulating layer, whereby the adhesion of the wiring trace to the second insulating layer is sufficiently improved.

(8) A method of manufacturing a printed circuit board according to another aspect of the present invention includes the steps of forming a wiring trace over a first insulating layer, forming a second insulating layer over the first insulating layer, being directly in contact with at least a first portion of a surface of the wiring trace, to cover the wiring trace, and forming a connection terminal over the first insulating layer to be electrically connected to the wiring trace and exposed from the second insulating layer.

This method of manufacturing the printed circuit board causes the wiring trace to be formed over the first insulating layer. The second insulating layer, being directly in contact with at least the first portion of the surface of the wiring trace, is formed over the first insulating layer to cover the wiring trace. The connection terminal is formed over the first insulating layer to be electrically connected to the wiring trace and exposed from the second insulating layer.

This configuration causes at least the first portion of the wiring trace to directly come into contact with the second insulating layer. As a result of the above-mentioned experiments and consideration by the present inventors, the transmission loss of the electrical signal is reduced by the direct contact of the wiring trace with the second insulating layer. Thus, the transmission loss of the electrical signal can be also reduced in the high frequency band.

(9) The method may further include the step of forming a thin metal film over a second portion that is different from the first portion of the surface of the wiring trace, wherein the step of forming the second insulating layer may include forming the second insulating layer, being directly in contact with the first portion of the wiring trace and being in contact with the thin metal film that is formed over the second portion, to cover the wiring trace.

In this case, improvement of the adhesion of the wiring trace to the second insulating layer in the second portion is easier while the transmission loss of the electrical signal in the first portion of the wiring trace is reduced. Thus, the transmission loss of the electrical signal in the high frequency band can be reduced while stripping of the second insulating layer is prevented. Further, it is unnecessary to perform the surface treatment, for attaching the wiring trace to the second insulating layer, on the entire wiring trace.

(10) The step of forming the connection terminal may include forming the connection terminal at an end of the wiring trace, and the second portion of the wiring trace may be positioned over a surface of the end of the wiring trace.

In this case, the adhesion of the wiring trace to the second insulating layer is improved at the end of the wiring trace. Thus, generation of a gap between the first insulating layer and the second insulating layer is prevented at the end of the wiring trace. As a result, the chemical liquid used for manufacture of the printed circuit board is prevented from entering the gap between the first insulating layer and the second insulating layer.

(11) The first portion may be a portion except for the second portion of the wiring trace.

In this case, the transmission loss of the electrical signal can be reduced in the entire portion except for the end of the wiring trace while the adhesion of the wiring trace to the second insulating layer is improved at the end of the wiring trace.

(12) The second portion may include a boundary portion between the wiring trace and the connection terminal, the step of forming the wiring trace may include forming the wiring trace and the first conductor layer, the step of forming the connection terminal may include forming a second conductor layer over the first conductor layer, and the step of forming the thin metal film may include forming the thin metal film between the wiring trace and the second insulating layer and between the first conductor layer and the second conductor layer, in the second portion.

In this case, the adhesion of the wiring trace to the second insulating layer is improved in the boundary portion between the wiring trace and the connection terminal. Thus, stripping of the second insulating layer in the boundary portion between the wiring trace and the connection terminal can be sufficiently prevented.

(13) The step of forming the thin metal film may include forming the thin metal film over the wiring trace and the first conductor layer, and removing the thin metal film except for a portion between the wiring trace and the second insulating layer and a portion between the first conductor layer and the second conductor layer, in the second portion.

In this case, the thin metal film can be easily formed only between the wiring trace and the second insulating layer and between the first conductor layer and the second conductor layer.

(14) The step of forming the thin metal film over the wiring trace and the first conductor layer may include forming the thin metal film by electroless plating.

In this case, the thin metal film can be easily formed over the wiring trace and the first conductor layer.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 1 is a plan view of a suspension board according to one embodiment of the present invention:

DESCRIPTION OF THE PREFERRED EMBODIMENTS

Figure 2A:
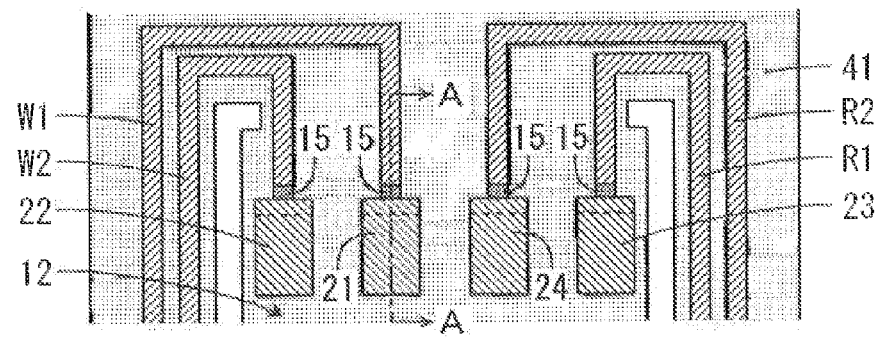
FIGS. 2A to 2C are plan views of connection terminals and their peripheral portions.

A printed circuit board and a method of manufacturing the printed circuit board according to one embodiment of the present invention will be described below with reference to drawings, A suspension board having circuits (hereinafter abbreviated as a suspension board) used for an actuator of a hard disc drive will be described as the printed circuit board according to the one embodiment of the present invention.

(1) Configuration of Suspension Board

FIG. 1 is a plan view of the suspension board according to the one embodiment of the present invention. In FIG. 1, a direction in which an arrow is directed is referred to as forward, and the opposite direction is referred to as rearward. As shown in FIG. 1, the suspension board 1 includes a suspension body 100 formed of an elongated metallic support substrate. In FIG. 1, the suspension body 100 extends substantially in a front-and-rear direction.

The suspension board 1 is supported by an elongated support plate 50. As indicated by dotted lines, write wiring traces W1, W2, read wiring traces R1, R2 and power wiring traces P1, P2 are formed over an upper surface of the suspension body 100.

At a tip end of the suspension body 100, a magnetic head supporting portion (hereinafter referred to as a tongue) 12 is provided by forming a U-shaped opening 11. The tongue 12 is bent along a broken line R to form a predetermined angle with the suspension body 100.

Four connection terminals 21, 22, 23, 24 are formed over an upper surface of the tongue 12 at one end of the suspension body 100. Further, two connection terminals 25, 26 are respectively formed over both sides of the vicinity of the center portion in a direction in which the suspension body 100 extends. A head slider having a magnetic head (not shown) is mounted on the upper surface of the tongue 12. Terminals of the magnetic head of the head slider are connected to the connection terminals 21 to 24 of the tongue 12. The connection terminals 25, 26 are respectively connected to two piezoelectric elements 61, 62 that are provided at the support plate 50.

Six connection terminals 31, 32, 33, 34, 35, 36 are formed over an upper surface of the other end of the suspension body 100. An electric circuit such as a preamplifier is connected to the connection terminals 31 to 34. A power circuit for the piezoelectric elements 61, 62 is connected to the connection terminals 35, 36. The connection terminals 21 to 26 are respectively electrically connected to the connection terminals 31 to 36 by the write wiring traces W1, W2, the read wiring traces R1, R2 and the power wiring traces P1, P2. Further, a plurality of holes H are formed in the suspension body 100.

The support plate 50 has a front end region 51, a rear end region 52 and a center region 53. The rear end region 52 is rectangular. The front end region 51 is trapezoidal, and the width is gradually reduced forward. The center region 53 has a rectangular shape that extends in the front-and-rear direction, and is arranged between the front end region 51 and the rear end region 52. With the suspension board 1 being supported by an upper surface of the support plate 50, the end of the suspension board 1 including the connection terminals 31 to 36 projects rearward from the rear end region 52.

A piezoelectric element mounting region 54 is provided in one portion of the center region 53. The piezoelectric element mounting region 54 overlaps with the connection terminals 25, 26 of the suspension board 1. Both side portions of the piezoelectric element mounting region 54 project to be curved outward. Further, a through hole 54h extending in a width direction (a direction that is perpendicular to the front-and-rear direction) is formed in the piezoelectric element mounting region 54. This configuration causes the piezoelectric element mounting region 54 of the support plate 50 to be stretchable in the front-and-rear direction.

The piezoelectric elements 61, 62 are mounted on a lower surface of the piezoelectric element mounting region 54 so as to cross the through hole 54h. The piezoelectric elements 61, 62 are respectively positioned on both sides of the suspension board 1. The piezoelectric elements 61, 62 are respectively connected to the connection terminals 25, 26 of the suspension board 1 through the through hole 54h.

Voltage is added to the piezoelectric element 61 via the connection terminals 25, 35 and the power wiring trace P1, and voltage is added to the piezoelectric element 62 via the connection terminals 26, 36 and the power wiring trace P2. Thus, with a stretch of the piezoelectric elements 61, 62, the support plate 50 is stretched in the front-and-rear direction. Subtle positioning of the magnetic head of the head slider on the suspension board 1 becomes possible by control of the voltage that is added to the piezoelectric elements 61, 62.

The suspension board 1 supported by the support plate 50 is provided at the hard disc drive. An electric current flows in the pair of write wiring traces W1, W2 at a time of writing the information in a magnetic disc. The write wiring trace W1 and the write wiring trace W2 constitute a differential signal line pair that transmits differential write signals. Further, an electric current flows in the pair of read wiring traces R1, R2 at a time of reading the information from the magnetic disc. The read wiring trace R1 and the read wiring trace R2 constitute a differential signal line pair that transmits differential read signals.

(2) Configuration of Connection Terminals and Their Peripheral Portions

Next, details of the connection terminals 21 to 26, 31 to 36 of the suspension board 1 and their peripheral portions will be described. FIGS. 2A to 3C are plan views of the connection terminals 21 to 26, 31 to 36 and their peripheral portions. FIGS. 4A to 4C are cross sectional views of the connection terminals 21 to 26, 31 to 36 and their peripheral portions. Scales of FIGS. 2A to 2C are different from one another, scales of FIGS. 3A to 3C are different from one another, and scales of FIGS. 4A to 4C are different from one another.

Figure 2B:
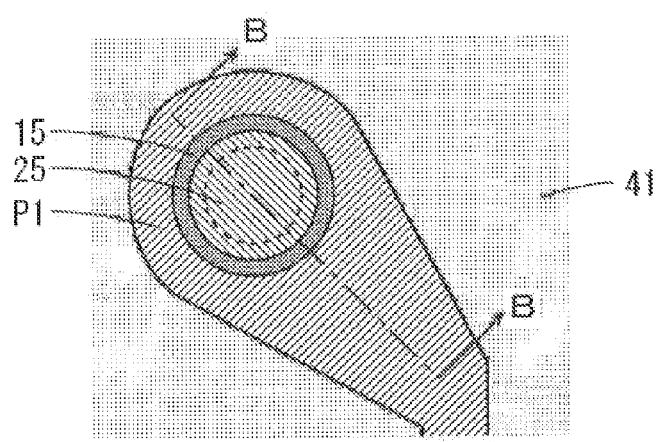
Figure 2C:
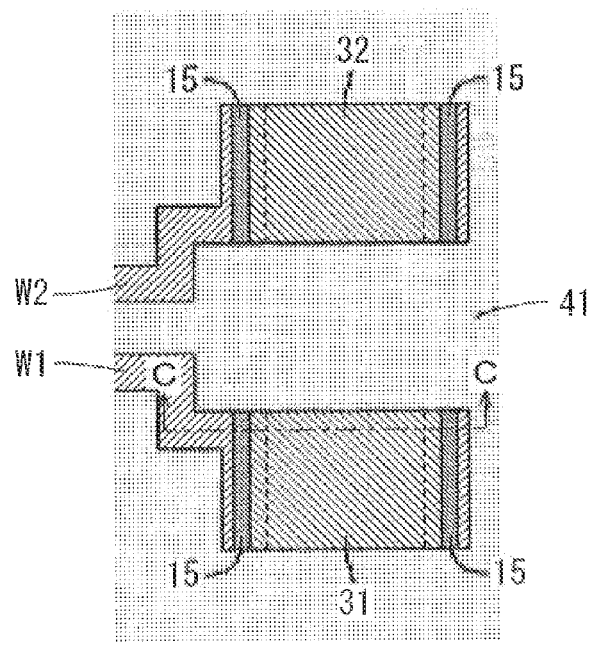
Figure 3A:
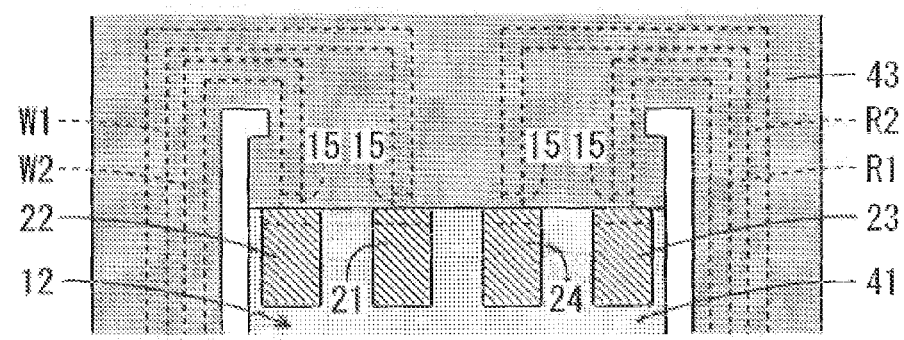
FIGS. 3A to 3C are plan views of the connection terminals and their peripheral portions.
Figure 3B:
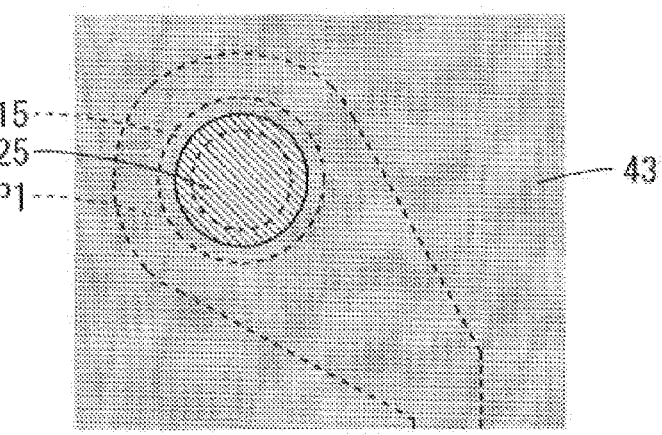
Figure 3C:
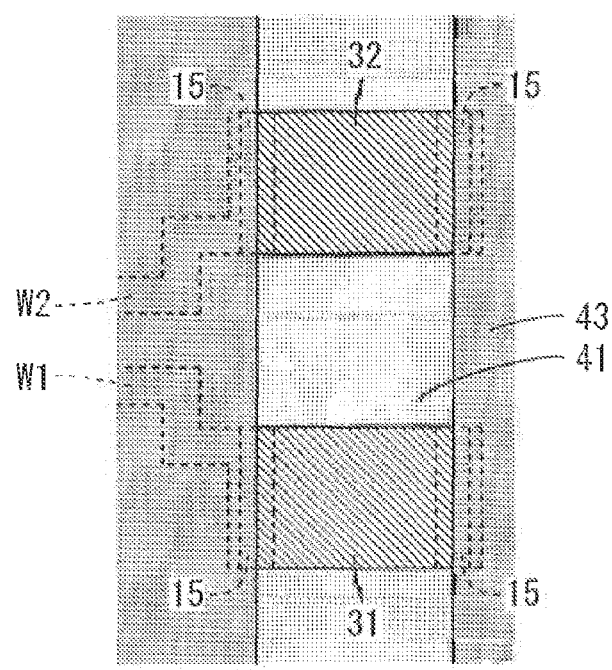
Figure 4A:
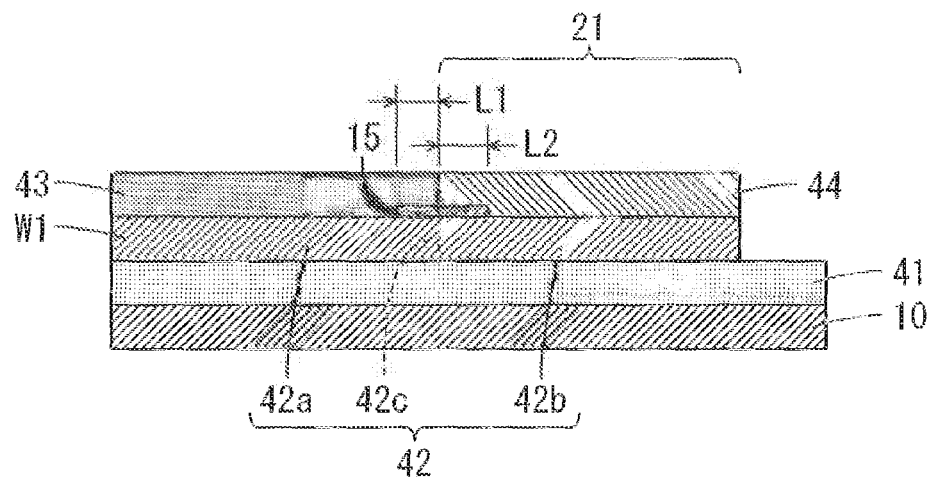
FIGS. 4A to 4C are cross sectional views of the connection terminal and its peripheral portions.
Figure 4B:
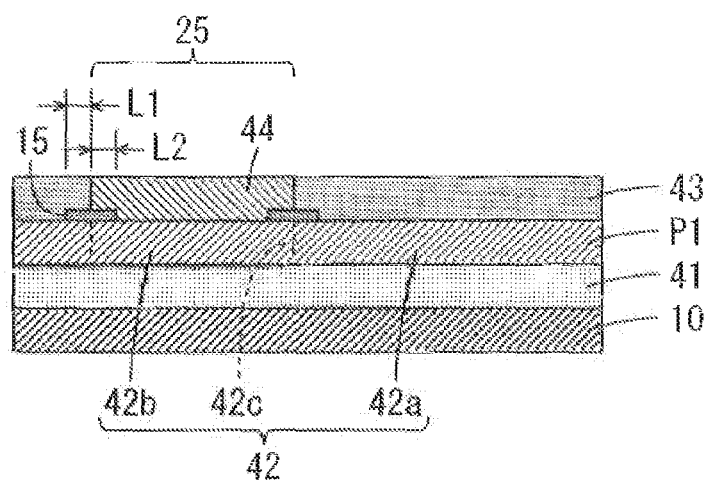
Figure 4C:
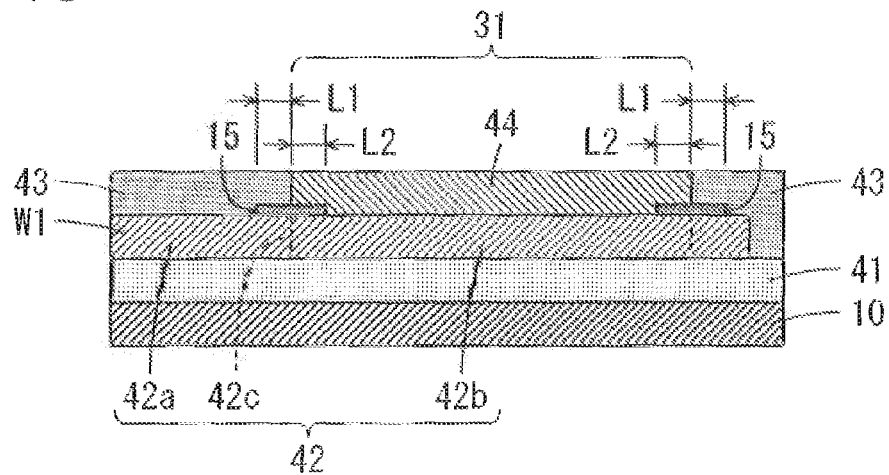

FIG. 2A and FIG. 3A show the connection terminals 21 to 24 and their peripheral portions, FIG. 2B and FIG. 3B show the connection terminal 25 and its peripheral portions, and FIG. 2C and FIG. 3C show the connection terminals 31, 32 and their peripheral portions. In FIGS. 2A to 2C, a coating layer 43 (see FIGS. 4A to 4C) is not shown. The connection terminal 26 has a similar configuration to the connection terminal 25, and the connection terminals 33 to 38 have a similar configuration to the connection terminals 31, 32.

FIGS. 4A to 4C respectively show an enlarged cross sectional view taken along the line A-A of FIG. 2A, an enlarged cross sectional view taken along the line B-B of FIG. 2B, and an enlarged cross sectional view taken along the line C-C of FIG. 2C. The same hatched and dotted patterns applied to each member of the cross sectional views of FIGS. 4A to 4C are applied to the members of the plan views of FIGS. 2A to 2C and FIGS. 3A to 3C in order to facilitate understanding of a configuration. The same is true for the below-mentioned FIGS. 5 to 12.

As shown in FIG. 2A, the connection terminals 21 to 24 are respectively formed at one ends of the write wiring traces W1, W2 and read wiring traces R1, R2. As shown in FIG. 2B, the connection terminal 25 is formed at one end of the power wiring trace P1, Similarly, the connection terminal 26 (FIG. 1) is formed at one end of the power wiring trace P2 (FIG. 1). As shown in FIG. 2C, the connection terminals 31, 32 are respectively formed at the other ends of the write wiring traces W1, W2. Similarly, the connection terminals 33 to 36 (FIG. 1) are respectively formed at the other ends of the read wiring traces R1, R2 (FIG. 1) and power wiring traces P1, P2 (FIG. 1).

As shown in FIGS. 3A to 3C, the coating layer 43 made of polyimide, for example, is formed over an insulating layer 41 to cover the write wiring traces W1, W2, the read wiring traces R1, R2 and the power wiring traces P1, P2. The connection terminals 21 to 26, 31 to 38 are exposed from the coating layer 43.

As shown in FIG. 4A, the insulating layer 41 made of polyimide, for example, is formed over a metallic support substrate 10 made of stainless steel, for example. A conductor layer 42 made of copper, for example, is formed over the insulating layer 41. The conductor layer 42 includes a trace portion 42a and a terminal portion 42b. The write wiring trace W1 is formed of the trace portion 42a. At the one end of the suspension body 100, a thin metal film 15 is formed over the conductor layer 42 to overlap with a boundary 42c between the trace portion 42a and the terminal portion 42b. The thin metal film 15 is a thin nickel film made by electroless plating, for example.

The coating layer 43 made of polyirnide, for example, is formed over a portion of the thin metal film 15 on the write wiring trace W1, and on the insulating layer 41 to cover the write wiring trace W1. Further, a metal layer 44 made of gold, for example, is formed over the thin metal film 15 on the terminal portion 42b, and the terminal portion 42b. The connection terminal 21 is constituted by the terminal portion 42b and the metal layer 44.

The thin metal film 15 projects by a length L1 between the write wiring trace W1 and the coating layer 43 from the boundary 42c. Further, the thin metal film 15 projects by a length L2 between the terminal portion 42b and the metal layer 44 from the boundary 42c.

Configurations of a boundary portion between the write wiring trace W2 and the connection terminal 22, a boundary portion between the read wiring trace R1 and the connection terminal 23 and a boundary portion between the read wiring trace R2 and the connection terminal 24 are similar to a configuration of a boundary portion between the write wiring trace W1 and the connection terminal 21 of the FIG. 4A.

Similarly, as shown in FIG. 4B, the power wiring trace P1 is formed of the trace portion 42a of the conductor layer 42. At substantially the center of the suspension body 100 in the front-and-rear direction, the thin metal film 15 is formed over the conductor layer 42 to overlap with the boundary 42c between the trace portion 42a and the terminal portion 42b. The thin metal film 15 on the power wiring trace P1 is annular.

The coating layer 43 is formed over the insulating layer 41 to cover a portion of the thin metal film 15 on the power wiring trace P1, and the power wiring trace P1. Further, the metal layer 44 is formed over the thin metal film 15 on the terminal portion 42b, and the terminal portion 42b. The connection terminal 25 is constituted by the terminal portion 42b and the metal layer 44. The thin metal film 15 projects by the length L1 between the power wiring trace P1 and the coating layer 43 from the boundary 42c. Further, the thin metal film 15 projects by the length L2 between the terminal portion 42b and the metal layer 44 from the boundary 42c.

A configuration of a boundary portion between the power wiring trace P2 and the connection terminal 26 is similar to a configuration of a boundary portion between the power wiring trace P1 and the connection terminal 25 of FIG. 4B.

As shown in FIG. 4C, at the other end of the suspension body 100, the thin metal film 15 is formed over the conductor layer 42 to overlap with the boundary 42c between the trace portion 42a and the terminal portion 42b. The coating layer 43 made of polyimide, for example, is formed over the insulating layer 41 to cover a portion of the thin metal film 15 on the write wiring trace W1, and the write wiring trace W1. Further, the metal layer 44 made of gold, for example, is formed over each thin metal film 15 on the terminal portion 42b, and the terminal portion 42b. The connection terminal 31 is constituted by the terminal portion 42b and the metal layer 44.

The thin metal film 15 projects by the length L1 between the write wiring trace W1 and the coating layer 43 from the boundary 42c. Further, the thin metal film 15 projects by the length L2 between the terminal portion 42b and the metal layer 44 from the boundary 42c.

Configurations of a boundary portion between the write wiring trace W2 and the connection terminal 32, a boundary portion between the read wiring trace R1 and the connection terminal 33, and a boundary portion between the read wiring trace R2 and the connection terminal 34 are similar to a configuration of a boundary portion between the write wiring trace W1 and the connection terminal 31 of FIG. 4C. Further, configurations of a boundary portion between the power wiring trace P1 and the connection terminal 35 and a boundary portion between the power wiring trace P2 and the connection terminal 36 are similar to a configuration of the boundary portion between the write wiring trace W1 and the connection terminal 31.

(3) Method of Manufacturing Suspension Board

The method of manufacturing the suspension board 1 will be described below. FIGS. 5A to 8C are schematic diagrams showing steps of manufacturing the suspension board 1 of FIG. 1. FIG. 5A to FIG. 6C show plan views of the connection terminals 21 to 24 and portions corresponding to their peripheries. FIG. 7A to FIG. 8C show cross sectional views taken along the lines D-D of FIG. 5A to FIG. 6C.

Figure 5A:
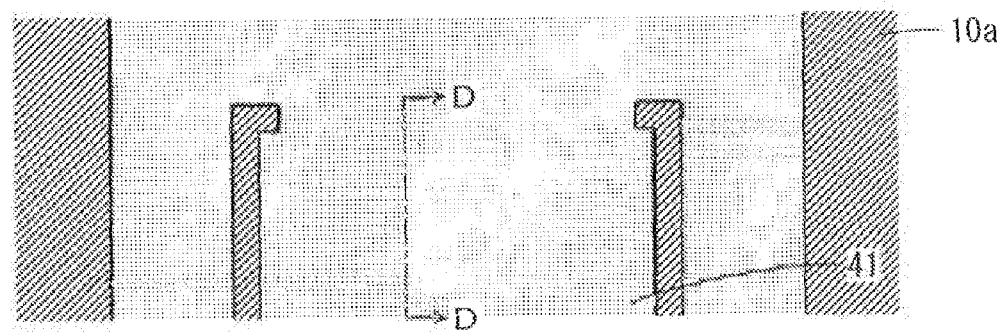
FIGS. 5A to 5D are schematic diagrams showing steps of manufacturing the suspension board of FIG. 1.
Figure 7A:
FIGS. 7A to 7D are schematic diagrams showing steps of manufacturing the suspension board of FIG. 1.

First, as shown in FIG. 5A and FIG. 7A, the insulating layer 41 made of polyimide, for example, is formed over a support layer 10a made of stainless steel, for example. The thickness of the support layer 10a is 10 μm to 50 μm, for example. The thickness of the insulating layer 41 is 5 μm to 15 μm, for example. The insulating layer 41 is formed in the same shape as the shape of the suspension board 1 of FIG. 1.

Figure 5B:
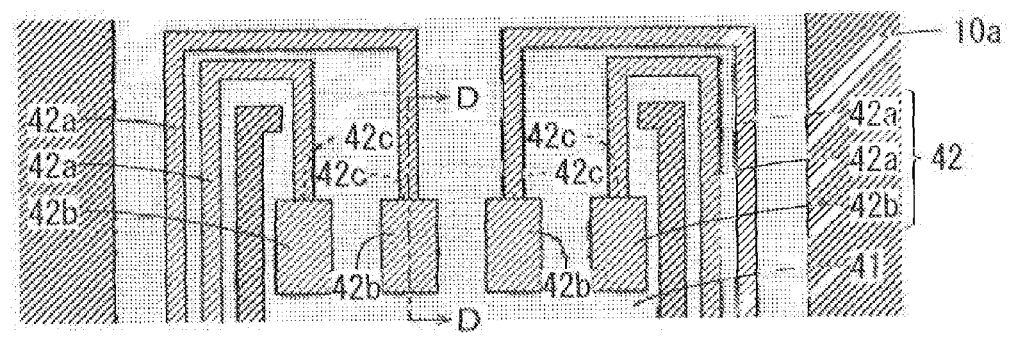
Figure 7B:
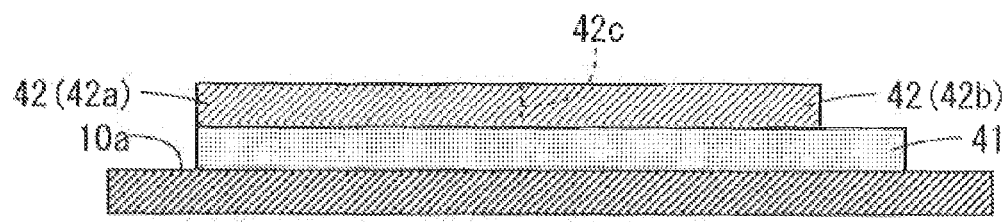

Next, as shown in FIG. 5B and FIG. 7B, the conductor layers 42 made of copper, for example, are formed over the insulating layer 41. Each conductor layer 42 has a predetermined pattern. The thickness of the conductor layer 42 is 1 μm to 20 μm, for example. In subsequent steps, each portion of the conductor layer 42 in which each of the write wiring traces W1, W2, read wiring traces R1, R2 and power wiring traces P1, P2 is formed is referred to as the trace portion 42a as described above.

Figure 5C:
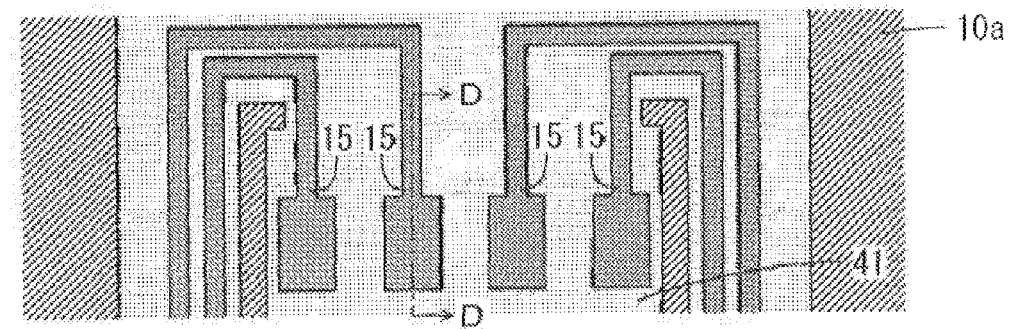
Figure 7C:
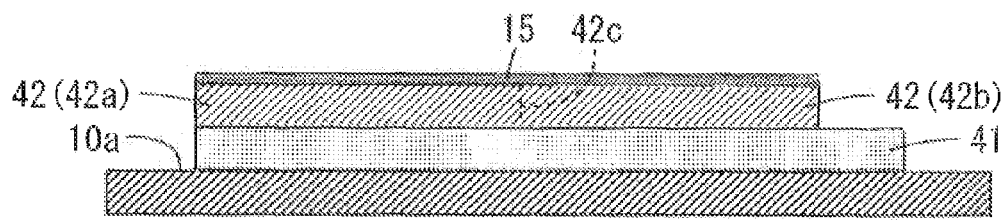

Then, as shown in FIG. 5C and FIG. 7C, each thin metal film 15 is formed over each conductor layer 42. The thin metal film 15 is formed by electroless plating, for example. In the formation process of the electroless plating, with the conductor layer 42 being soaked in an electroless plating liquid including nickel and a reductant, for example, a nickel plating coating grows on the conductor layer 42 with a catalyst such as palladium being used as a core.

While the thin metal film 15 is preferably formed of nickel, the invention is not limited to this. The thin metal film 15 may be formed of gold (An), platinum (Pt), silver (Ag) or tin (Sn). Even in this case, adhesion of each trace portion 42a to the coating layer 43 can be improved. The thickness of the thin metal film 15 is preferably not less than 1 nm and not more than 1000 nm, is more preferably not less than 10 nm and not more than 200 nm, and is even more preferably not less than 10 nm and not more than 150 nm.

Figure 5D:
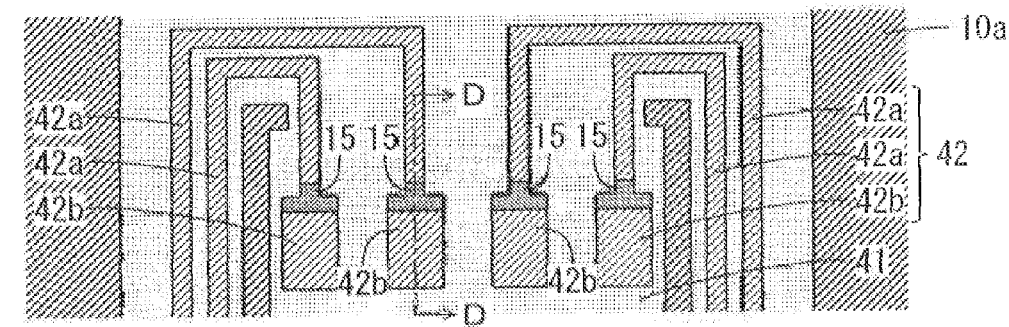
Figure 7D:
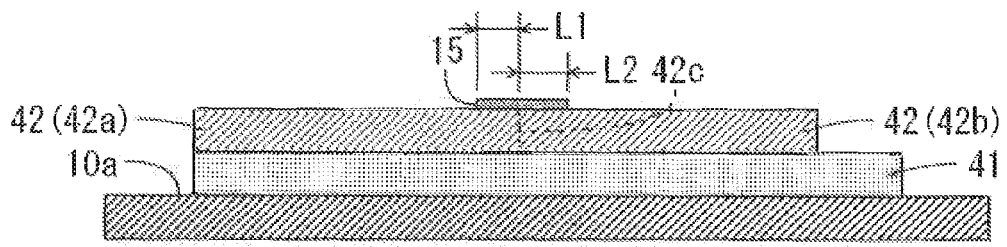

Thereafter, as shown in FIG. 5D and FIG. 7D, each thin metal film 15 is removed except for portions in the vicinity of each boundary 42c of each conductor layer 42. The thin metal film 15 is removed by a photolithographic technique, for example. Thus, the thin metal film 15 in the portion in vicinity of the boundary 42c of the conductor layer 42 remains.

The length L1 of a portion of the thin metal film 15, which projects from the boundary 42c on each trace portion 42a is preferably not less than 1 µm and not more than 30000 µm, is more preferably not less than 10 µm and not more than 1000 µm, and is even more preferably not less than 10 µm and not more than 100 µm. The length L2 of a portion of the thin metal film 15, which projects from the boundary 42c on each terminal portion 42b is preferably not less than 1 µm and not more than 1000 µm, and more preferably not less than 10 µm and not more than 100 µm.

Figure 6A:
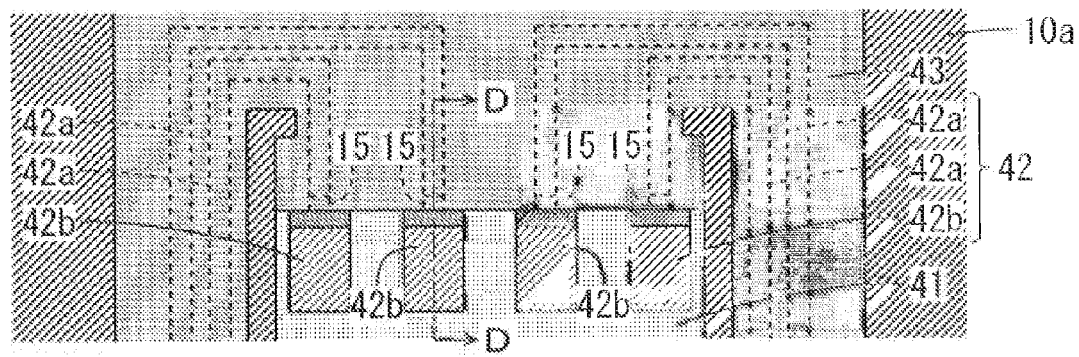
FIGS. 6A to 6C are schematic diagrams showing steps of manufacturing the suspension board of FIG. 1.
Figure 8A:
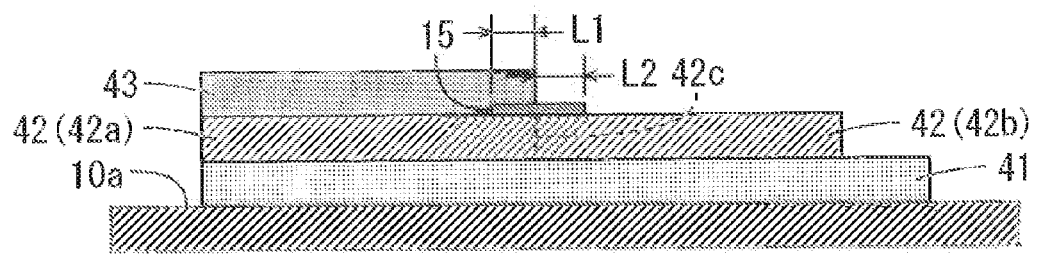
FIGS. 8A to 8C are schematic diagrams showing steps of manufacturing the suspension board of FIG. 1.

Next, as shown in FIG. 6A and FIG. 8A. the coating layer 43 made of polyimide, for example, is formed over the insulating layer 41 to cover each trace portion 42a, and each thin metal film 15 on the trace portion 42a. The thickness of the coating layer 43 is 2 µm to 10 µm, for example. Thus, each terminal portion 42b is exposed from the coating layer 43. Further, each portion, having the length L1, of the thin metal film 15 on the trace portion 42a is covered by the coating layer 43, and each portion, having the length L2, of the thin metal film 15 on the terminal portion 42b is exposed from the coating layer 43.

Figure 6B:
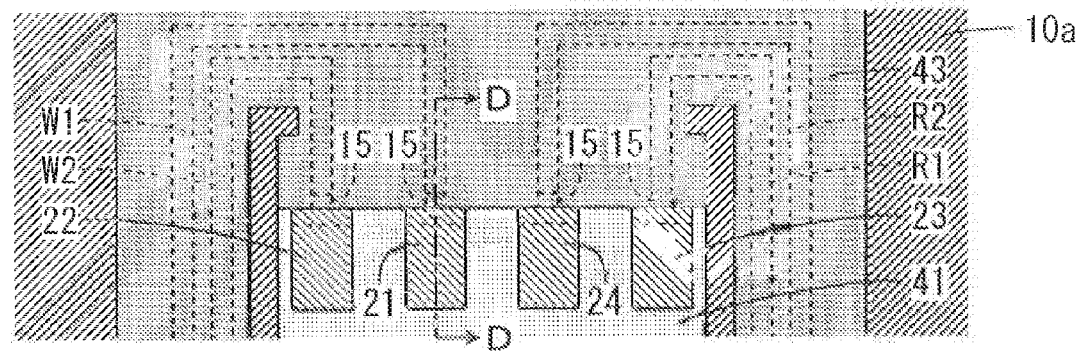
Figure 8B:
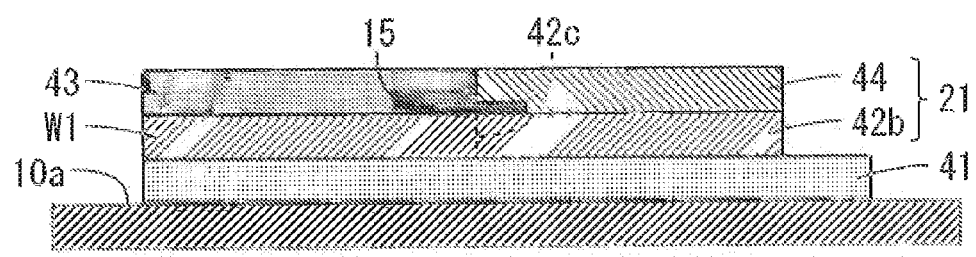

Subsequently, as shown in FIG. 6B and FIG. 8B, each metal layer 44 is formed over each terminal portion 42b, and each thin metal film 15 on the terminal portion 42b. In the present example, a nickel plating layer having a thickness of 0.01 µm to 5 µm and a gold plating layer having a thickness of 0.1 µm to 5 µm are sequentially formed over the terminal portion 42b, whereby the metal layer 44 is formed. Each of the connection terminals 21 to 26, 31 to 36 is formed of the terminal portion 42b and the metal layer 44, and each of the write wiring traces W1, W2, read wiring traces R1, R2 and power wiring traces P1, P2 is formed of the trace portion 42a.

The distance between the write wiring traces W1, W2, and the distance between the read wiring traces R1, R2 are respectively 5 µm to 100 µm. for example. Similarly, the distance between the write wiring trace W1 and the power wiring trace P1, and the distance between the read wiring trace R2 and the power wiring trace P2 are respectively 5 µm to 100 µm, for example. The width of each of the write wiring traces W1, W2, read wiring traces R1, R2 and power wiring traces P1, P2 is 5 µm to 200 µm, for example.

Figure 6C:
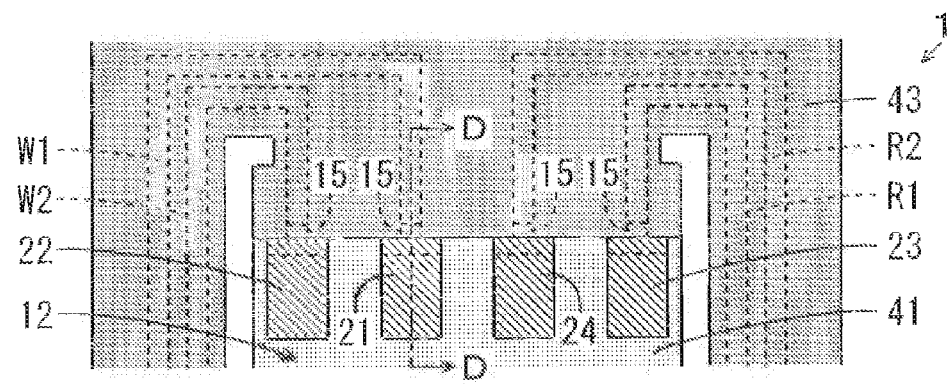
Figure 8C:
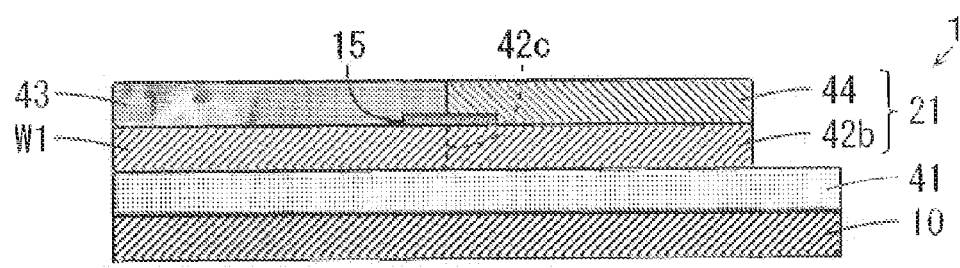

Thereafter, as shown in FIG. 6C and FIG. 8C, the support layer 10a is processed such that a portion, of the support layer 10a, which overlaps with the insulating layer 41 remains. Thus, the support substrate 10 is formed. The process of the support layer 10a is performed by etching, for example. Thus, the suspension board 1 is completed.

(4) Other Embodiments (a) While the thin metal film 15 is formed over the portion in the vicinity of the boundary 42c of the conductor layer 42 in the above-mentioned embodiment, the invention is not limited to this. The thin metal film 15 may be formed over any portion of the trace portion 42a that is different from the portion in the vicinity of the boundary 42c of the conductor layer 42. Even in this case, adhesion of each of the write wiring traces W1, W2, read wiring traces R1, R2 and power wiring traces P1, P2 to the coating layer 43 can be increased. Further, when the adhesion of each of the write wiring traces W1, W2, read wiring traces R1, R2 and power wiring traces P1, P2 to the coating layer 43 is sufficiently high, the thin metal film 15 does not have to be formed over the conductor layer 42.

(b) While the printed circuit board is the suspension board 1 including the support substrate 10 in the above-mentioned embodiment, the invention is not limited to this. The printed circuit board may be a flexible printed circuit board that does not include the support substrate 10, for example.

(c) While the thin metal film 15 is formed by the electroless plating in the above-mentioned embodiment, the invention is not limited to this. The thin metal film 15 may be formed using another method such as a semi-additive method or a subtractive method.

(5) Effects

In the present embodiment, the thin metal film 15 is formed over the portion in the vicinity of the boundary 42c of the conductor layer 42 on the insulating layer 41. The coating layer 43, being directly in contact with the trace portion 42a except for the portion in the vicinity of the boundary 42c of the conductor layer 42 and being in contact with the thin metal film 15, is formed over the insulating layer 41 to cover the trace portion 42a. The terminal portion 42b is exposed from the coating layer 43.

This configuration causes the trace portion 42a except for the portion in the vicinity of the boundary 42c of the conductor layer 42 to directly come into contact with the coating layer 43. As a result of experiments and consideration by the present inventors, a transmission loss of an electrical signal is reduced by direct contact of the trace portion 42a with the coating layer 43. Thus, the transmission loss of the electrical signal can be also reduced in a high frequency band.

Further, adhesion of the trace portion 42a to the coating layer 43 can be improved at the end of the trace portion 42a on which the thin metal film 15 is formed. Further, the transmission loss of the electrical signal can be reduced in the entire portion except for the end of the trace portion 42a. Thus, the transmission loss of the electrical signal in the high frequency band can be reduced while stripping of the coating layer 43 is prevented. Further, it is unnecessary to perform surface treatment, for attaching the trace portion 42a to the coating layer 43, on the entire trace portion 42a.

Further, at the end of the trace portion 42a, generation of a gap between the insulating layer 41 and the coating layer 43 is prevented, As a result, a chemical liquid used for manufacture of the suspension board 1 is prevented from entering the gap between the insulating layer 41 and the coating layer 43.

(6) Inventive Examples

Figure 9A:
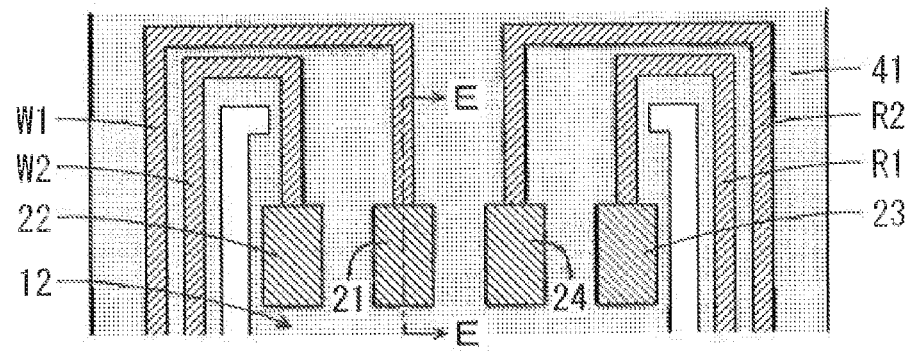
FIGS. 9A to 9C are plan views of the connection terminals of the suspension board and their peripheral portions according to an inventive example 1.
Figure 9B:
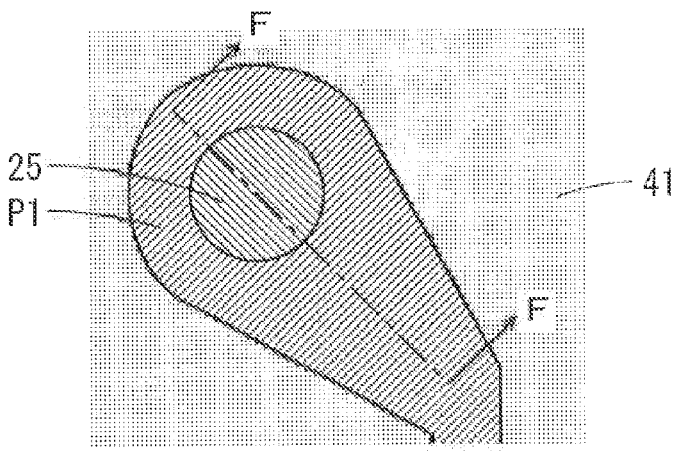
Figure 9C:
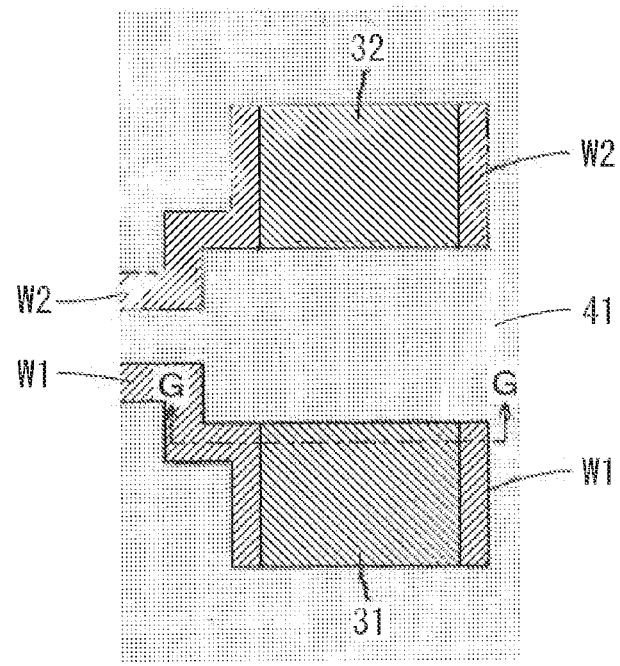
Figure 10A:
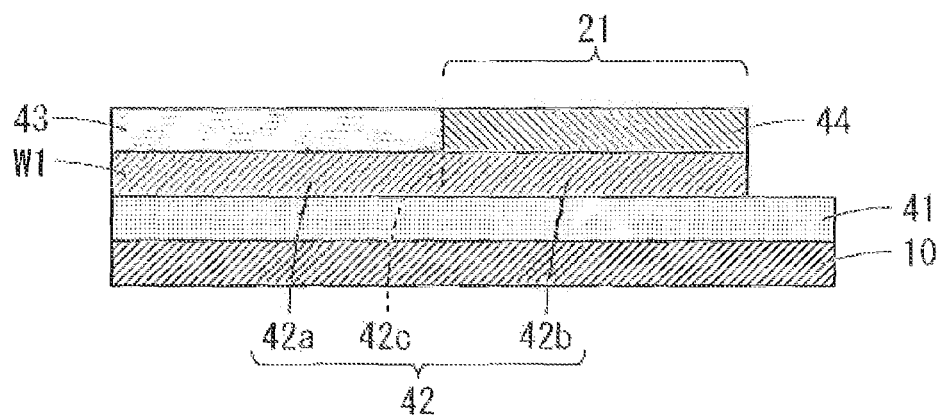
FIGS. 10A to 10C are cross sectional views of the connection terminals of the suspension board and their peripheral portions according to the inventive example 1.
Figure 10B:
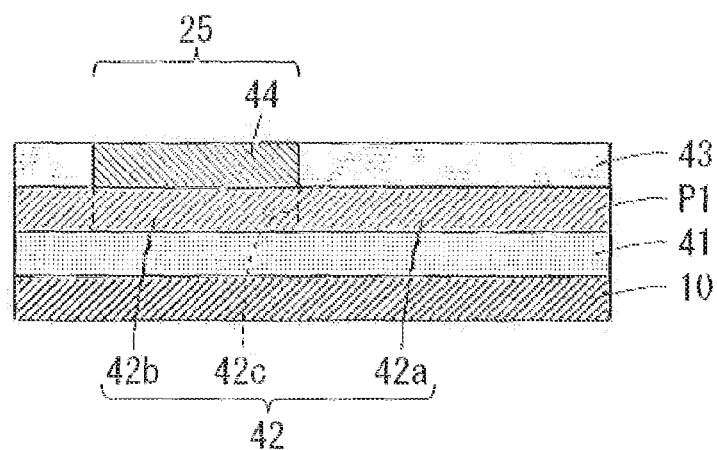
Figure 10C:
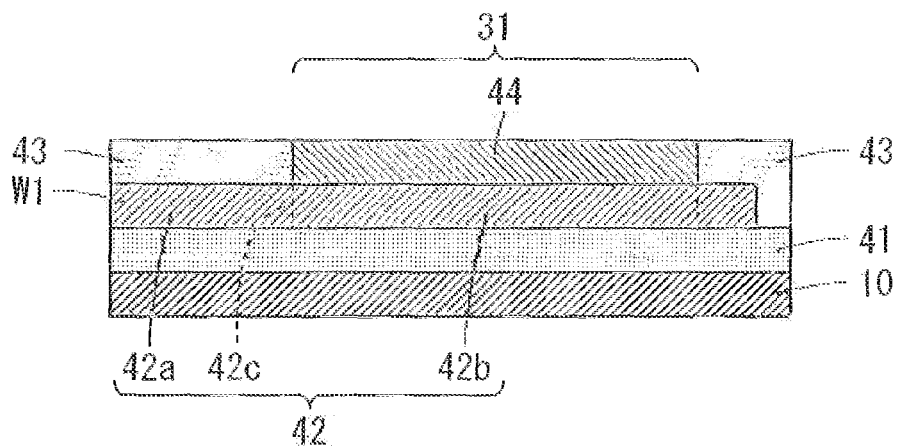

As the inventive examples 1, 2 and comparative examples 1, 2, suspension boards described below were fabricated. FIGS. 9A to 9C are plan views of the connection terminals 21 to 26, 31 to 36 of the suspension board and their peripheral portions according to the inventive example 1. FIGS. 10A to 10C are cross sectional views of the connection terminals 21 to 26, 31 to 36 of the suspension board and their peripheral portions according to the inventive example 1. FIGS. 10A to 10C respectively show an enlarged cross sectional view taken along the line E-E of FIG. 9A, an enlarged cross sectional view taken along the line F-F of FIG. 9B and an enlarged cross sectional view taken along the line G-G of FIG. 9C. In FIG. 9, a coating layer 43 is not shown.

Figure 11A:
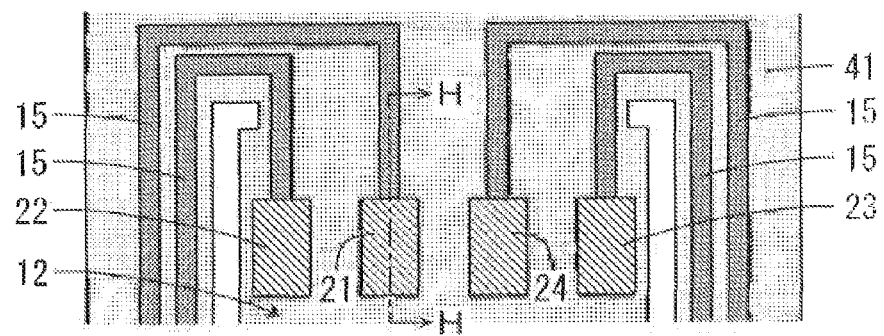
FIGS. 11A to 11C are plan views of the connection terminals of the suspension board and their peripheral portions according to a comparative example 1.
Figure 11B:
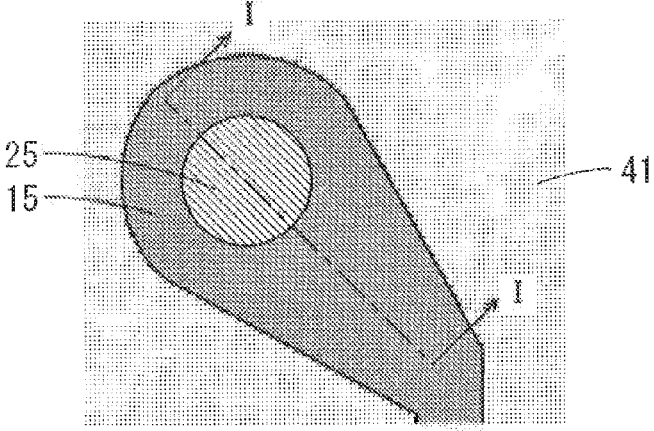
Figure 11C:
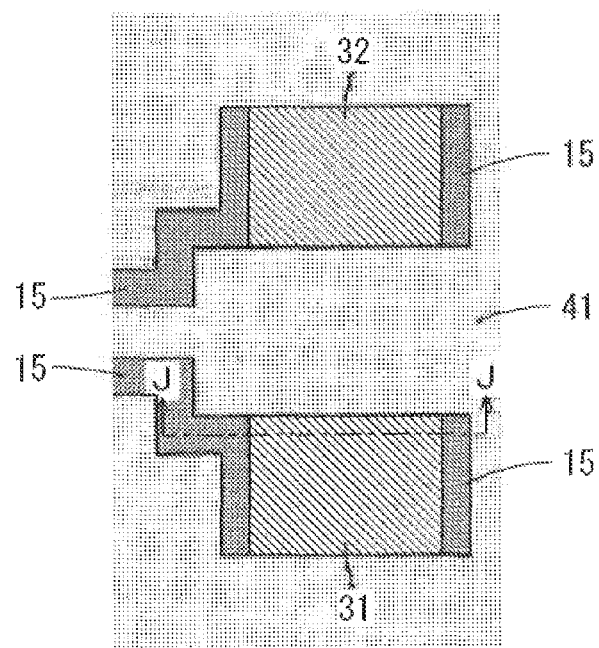
Figure 12A:
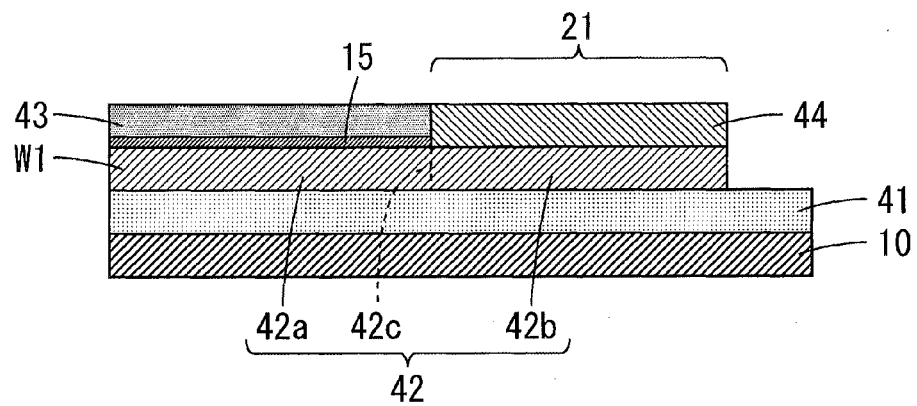
FIGS. 12A to 12C are cross sectional views of the connection terminals of the suspension board and their peripheral portions according to the comparative example 1.
Figure 12B:
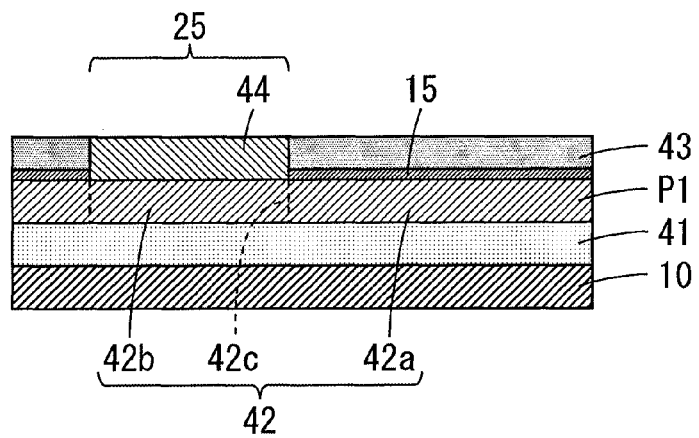
Figure 12C:
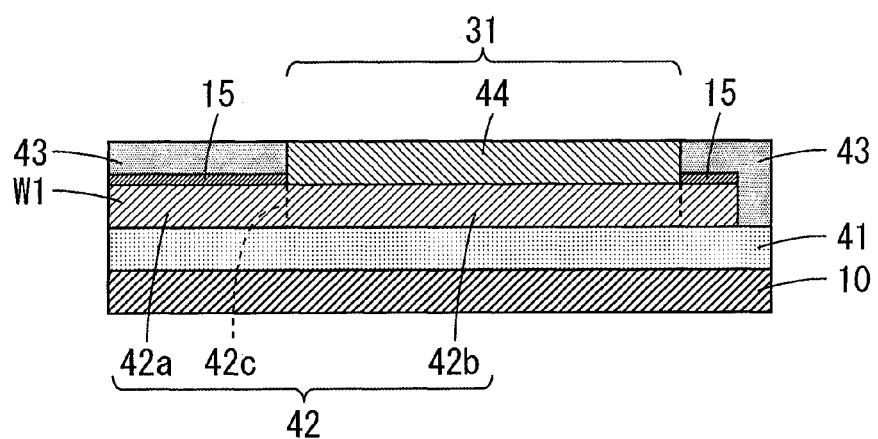

FIGS. 11A to 11C are plan views of the connection terminals 21 to 26, 31 to 36 of the suspension board and their peripheral portions according to the comparative example 1. FIGS. 12A to 12C are cross sectional views of the connection terminals 21 to 26, 31 to 36 of the suspension board and their peripheral portions according to the comparative example 1. FIGS. 12A to 12C respectively show an enlarged cross sectional view taken along the line H-H of FIG. 11A, an enlarged cross sectional view taken along the line I-I of FIG. 11B, and an enlarged cross sectional view taken along the line J-J of FIG. 11C. In FIGS. 11A to 11C, the coating layer 43 is not shown.

The suspension board according to the inventive example 1 has the similar configuration to the suspension board 1 of FIG. 2A to FIG. 4C except for the following points. In the steps of manufacturing the suspension board according to the inventive example 1, steps of FIGS. 5C and 5D are omitted. Therefore, as shown in FIGS. 9A to 9C and FIGS. 10A to 10C, in the suspension board according to the inventive example 1, a thin metal film 15 is not formed over each trace portion 42a and each terminal portion 42b.

The suspension board according to the inventive example 2 has the similar configuration to the suspension board 1 of FIG. 2A to FIG. 4C. In the suspension board according to the inventive example 2, a length L1 of a portion of each thin metal film 15, which projects between a trace portion 42a and a coating layer 43 from a boundary 42c, is 50 μm. Further, a length L2 of a portion of the thin metal film 15, which projects between a terminal portion 42b and a metal layer 44 from the boundary 42c, is 20 μm.

The suspension board according to the comparative example 1 has the similar configuration to the suspension board 1 of FIGS. 2A to FIG. 4C except for the following points. In the step of manufacturing the suspension board according to the comparative example 1, only each thin metal film 15 on a terminal portion 42b is removed in the step of FIG. 5D. Therefore, as shown in FIGS. 11A to 11C and FIGS. 12A to 12C, in the suspension board according to the comparative example 1, the thin metal film 15 is formed over an entire trace portion 42a. On the other hand, the thin metal film 15 is not formed over each terminal portion 42b. The thickness of the thin metal film 15 on each trace portion 42a is not less than 50 nm and not more than 100 nm.

The suspension board according to the comparative example 2 has the similar configuration to the suspension board according to the comparative example 1 except for the following point. In the suspension board according to the comparative example 2, the thickness of a thin metal film 15 on a trace portion 42a exceeds 100 nm.

Figure 13:
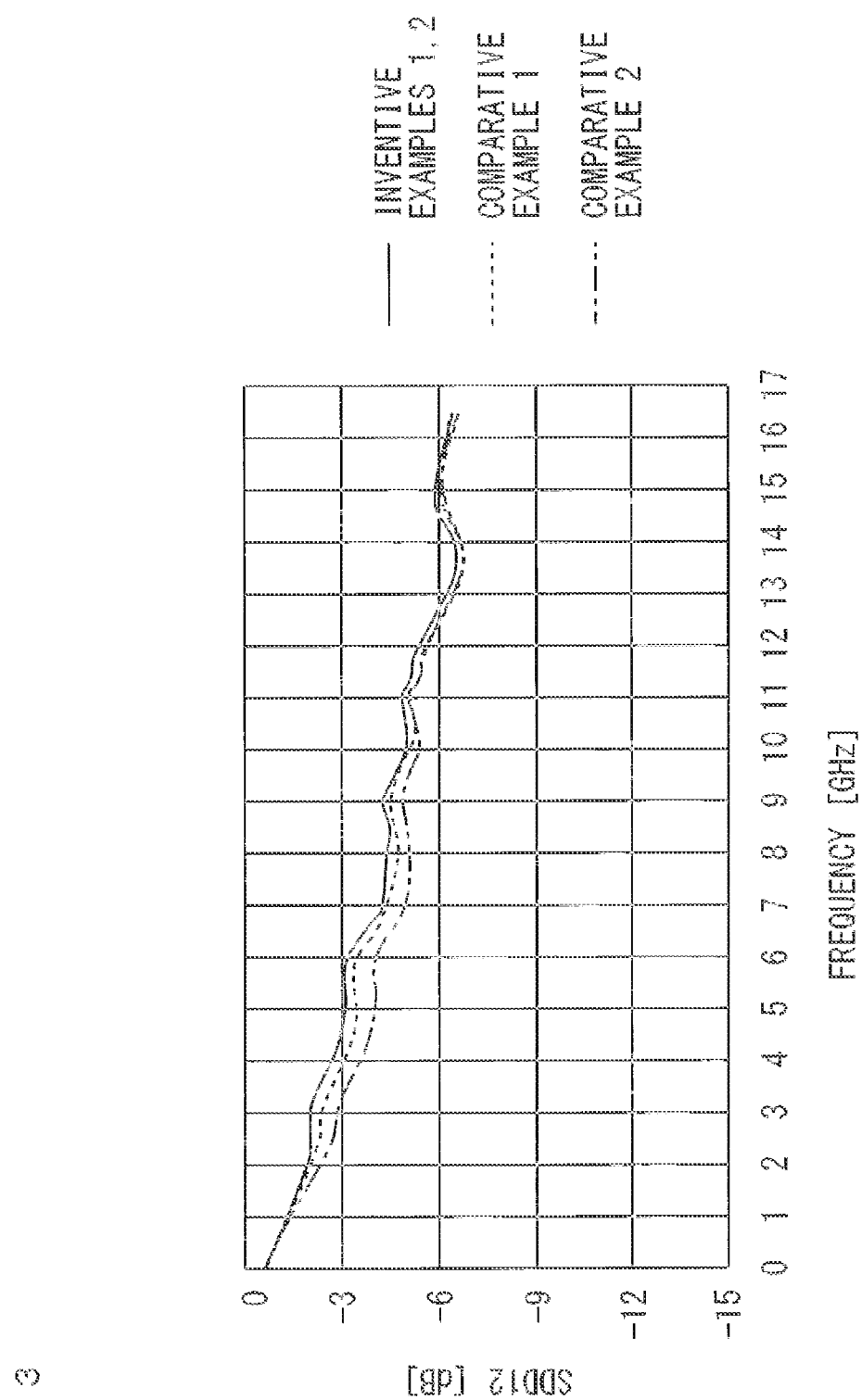
FIG. 13 is a diagram showing results of measurement of a parameter SDD12 regarding write wiring traces.

A parameter SDD12, which indicates transmission characteristics when the electric signal is transmitted by each of the write wiring traces W1, W2 and the read wiring traces R1, R2 of the suspension boards according to the inventive examples 1, 2 and the comparative examples 1, 2, was measured. FIG. 13 is a diagram showing the results of measurement of the parameter SDD12 regarding the write wiring traces W1, W2, FIG. 14 is a diagram showing the results of measurement of the parameter SDD12 regarding the read wiring traces R1, R2.

Figure 14:
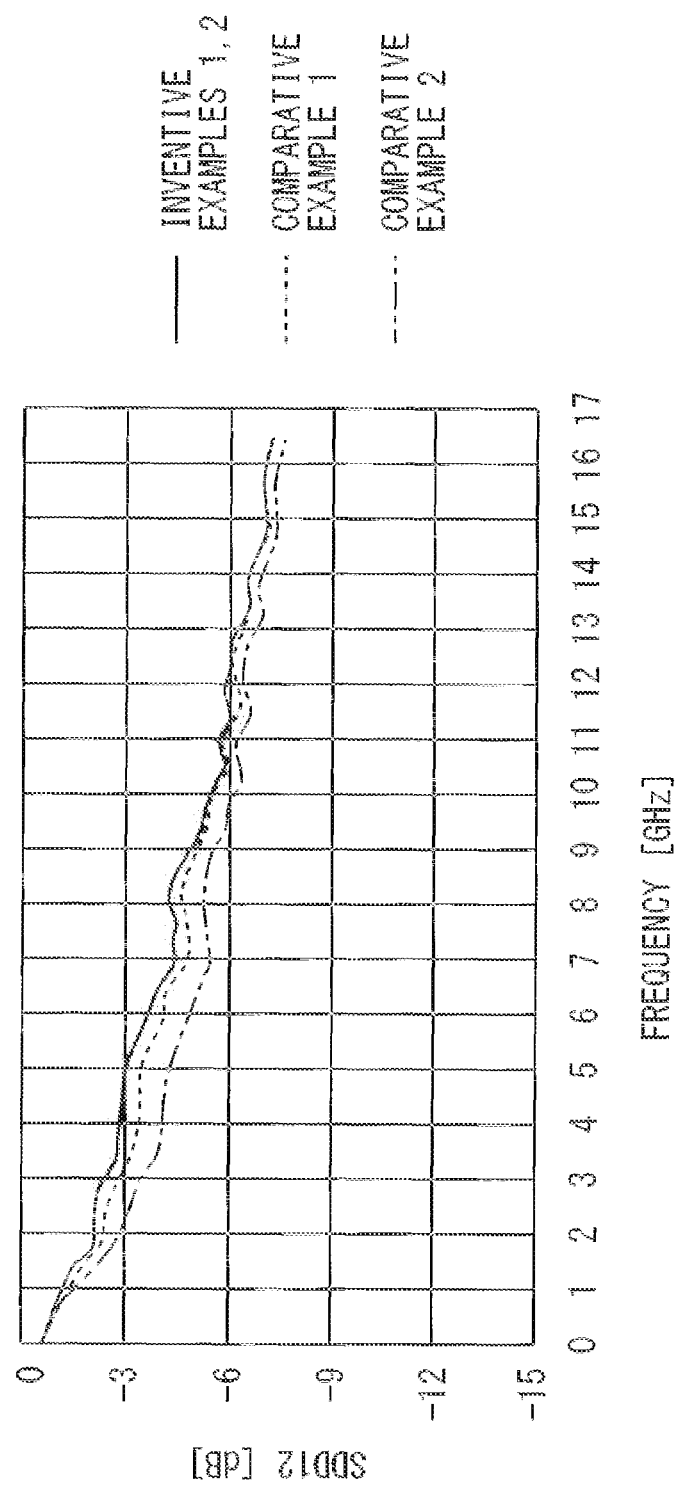
FIG. 14 is a diagram showing results of measurement of the parameter SDD12 regarding read wiring traces.

In FIGS. 13 and 14, the ordinate indicates the parameter SDD12 [dB], and the abscissa indicates a frequency [GHz] of the electric signal. Further, in FIGS. 13 and 14, results of measurement in the inventive examples 1, 2 are indicated by a solid line, a result of measurement regarding the comparative example 1 is indicated by a dotted line, and a result of measurement regarding the comparative example 2 is indicated by a dot and dashed line.

As shown in FIGS. 13 and 14, in a high frequency band of not less than 1 GHz, the parameter SDD12 in the inventive examples 1, 2 is higher than the parameter SDD12 in the comparative example 1. Further, in the high frequency band of not less than 1 GHz, the parameter SDD12 in the comparative example 1 is higher than the parameter SDD12 in the comparative example 2. The parameter SDD12 in the inventive example 1 and the parameter SDD12 in the inventive example 2 are substantially equal to each other.

From the result of comparison between the inventive examples 1, 2 and the comparative examples 1, 2, it was confirmed that an amount of reduction of the parameter SDD12 in the high frequency band is reduced by removal of the thin metal film 15 of each of the write wiring traces W1, W2 and read wiring traces R1, R2. Further, from the result of comparison between the comparative examples 1, 2, it was confirmed that the amount of reduction of the parameter SDD12 in the high frequency band is reduced by a reduction in thickness of the thin metal films 15 on each of the write wiring traces W1, W2 and read wiring traces R1, R2.

(7) Correspondence between Constituent Elements in Claims and Parts in Preferred Embodiments In the following paragraphs, non-limiting examples of correspondence between various elements recited in the claims below and those described above with respect to various preferred embodiments of the present invention are explained.

In the above-mentioned embodiment, the insulating layers 41 and the coating layer 43 are respectively examples of first and second insulating layers, the write wiring traces W1, W2, the read wiring traces R1, R2 or the power wiring traces P1, P2 are examples of a wiring trace. The connection terminals 21 to 26, 31 to 36 are examples of a connection terminal, the suspension board 1 is an example of a printed circuit board, the thin metal film 15 is an example of a thin metal film, the terminal portion 42b and the metal layer 44 are respectively examples of first and second conductor layers.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:
1. A printed circuit board comprising:
a first insulating layer;
a wiring trace formed over the first insulating layer and having a first portion and a second portion that is different from the first portion;
a thin metal film formed over the second portion of the wiring trace;
a second insulating layer formed over the first insulating layer to cover the wiring trace, the second insulating layer being directly in contact with at least the first portion of the wiring trace and being in contact with the thin metal film; and a connection terminal formed over the first insulating layer to be electrically connected to the wiring trace and exposed from the second insulating layer.

2. The printed circuit board according to claim 1, wherein the wiring trace has an end connected to the connection terminal, and
the second portion of the wiring trace is positioned on a surface of the end of the wiring trace.

3. The printed circuit board according to claim 2, wherein the first portion is a portion except for the second portion of the wiring trace.

4. The printed circuit board according to claim 3, wherein the second portion includes a boundary portion between the wiring trace and the connection terminal,
the connection terminal includes a first conductor layer and a second conductor layer formed over the first conductor layer, and
the thin metal layer is positioned between the wiring trace and the second insulating layer and between the first conductor layer and the second conductor layer, in the second portion.

5. The printed circuit board according to claim 1, wherein adhesivity of the thin metal film to the second insulating layer is higher than adhesivity of the wiring trace to the second insulating layer.

6. The printed circuit board according to claim 5, wherein the wiring trace includes copper, and the thin metal film includes nickel, gold, platinum, silver or tin.

7. A method of manufacturing a printed circuit board, including the steps of:
    forming a wiring trace having a first portion and a second portion that is different from the first portion over a surface of a first insulating layer,
    forming a thin metal film formed at the second portion of the wiring trace,
    forming a second insulating layer over the first insulating layer to cover the wiring trace, the second insulating layer being directly in contact with at least the first portion of the wiring trace and being in contact with the thin metal film, and
    forming a connection terminal over the first insulating layer to be electrically connected to the wiring trace and exposed from the second insulating layer.

8. The method of manufacturing the printed circuit board according to claim 7, wherein
    the step of forming the connection terminal includes forming the connection terminal at an end of the wiring trace, and
    the second portion of the wiring trace is positioned on a surface at the end of the wiring trace.

9. The method of manufacturing the printed circuit board according to claim 8, wherein
    the first portion is a portion except for the second portion of the wiring trace.

10. The method of manufacturing the printed circuit board according to claim 9, wherein
    the second portion includes a boundary portion between the wiring trace and the connection terminal,
    the step of forming the wiring trace includes forming the wiring trace and the first conductor layer,
    the step of forming the connection terminal includes forming a second conductor over the first conductor, and
    the step of forming the thin metal film includes forming the thin metal film between the wiring trace and the second insulating layer and between the first conductor layer and the second conductor layer, in the second portion.

11. The method of manufacturing the printed circuit board according to claim 10, wherein the step of forming the thin metal film includes:
    forming the thin metal film over the wiring trace and the first conductor layer, and
    removing the thin metal film except for a portion between the wiring trace and the second insulating layer and a portion between the first conductor layer and the second conductor layer, in the second portion.

12. The method of manufacturing the printed circuit board according to claim 11, wherein
    the step of forming the thin metal film over the wiring trace and the first conductor layer includes forming the thin metal film by electroless plating.

\* \* \* \* \*